United States Patent
Rusu

(10) Patent No.: US 7,341,953 B2
(45) Date of Patent: Mar. 11, 2008

(54) MASK PROFILE CONTROL FOR CONTROLLING FEATURE PROFILE

(75) Inventor: Camelia Rusu, Fremont, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 11/406,485

(22) Filed: Apr. 17, 2006

(65) Prior Publication Data
US 2007/0243712 A1    Oct. 18, 2007

(51) Int. Cl.
*H01L 21/302* (2006.01)
(52) U.S. Cl. .................... 438/706; 438/723
(58) Field of Classification Search ............. 438/700, 438/703, 706, 712, 714, 717, 723, 725
See application file for complete search history.

(56) References Cited

U.S. PATENT DOCUMENTS

| | | | |
|---|---|---|---|
| 5,902,704 A * | 5/1999 | Schoenborn et al. .......... 430/5 |
| 6,004,853 A * | 12/1999 | Yang et al. ................. 438/305 |
| 6,387,819 B1 * | 5/2002 | Yu ............................. 438/725 |
| 6,485,988 B2 * | 11/2002 | Ma et al. ....................... 438/3 |
| 2004/0058552 A1 * | 3/2004 | Higuchi ..................... 438/710 |
| 2004/0072443 A1 * | 4/2004 | Huang et al. ............... 438/710 |
| 2005/0070117 A1 * | 3/2005 | Jacobs et al. .............. 438/710 |

* cited by examiner

*Primary Examiner*—Kin-Chan Chen
(74) *Attorney, Agent, or Firm*—Beyer Weaver LLP

(57) ABSTRACT

A method for etching features into a dielectric layer over a substrate and existent below a polymeric hard mask is provided. The substrate is placed in a plasma processing chamber. Mask features are etched into the polymeric hard mask and necks are formed inadvertently. A plasma treatment process performed before the dielectric etch step process can selectively etch away the necks. As a result, neckless features are created into the polymeric hardmask. Features etched into the underneath dielectric layer through the neckless polymeric hard mask have straight profiles.

3 Claims, 10 Drawing Sheets

MASK PROFILE CONTROL FOR CONTROLLING FEATURE PROFILE

BACKGROUND OF THE INVENTION

The present invention relates to etching an etch layer through a mask during the production of a semiconductor device. More specifically, the present invention relates to etching a dielectric layer through a polymeric hard mask during the production of semiconductor devices.

During semiconductor wafer processing, features of the semiconductor device are defined in the wafer using well-known patterning and etching processes. In these processes, a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby produce the desired features in the wafer.

To allow deeper etching at high resolution, a hardmask may be placed between the photoresist mask and the etch layer

SUMMARY OF THE INVENTION

To achieve the foregoing and in accordance with the purpose of the present invention a method for etching features in a dielectric layer over a substrate and disposed below a polymeric hard mask is provided. The substrate is placed in a plasma processing chamber. Mask features are etched into the polymeric hard mask, wherein the features are neckless, comprising etching mask features with necks into the hard mask and treating the mask features to selectively etch away the necks. Features are etched into the dielectric layer through the polymeric hard mask.

In another manifestation of the invention, a method for etching features in a dielectric layer over a substrate and disposed below a polymeric hard mask is provided. A patterned photoresist mask is formed over the polymeric hard mask. The substrate is placed in a plasma processing chamber. Mask features are etched into the polymeric hard mask through the photoresist mask, comprising etching mask features with necks into the hard mask, comprising providing a mask etchant gas, generating a plasma from the mask etchant gas, and stopping the flow of the mask etchant gas and treating the mask features to selectively etch away the necks, comprising providing a treatment gas comprising fluorocarbon, wherein the treatment gas is different than the mask etchant gas, generating a plasma from the treatment gas, and stopping the flow of the treatment gas. Features are etched into the dielectric layer through the polymeric hard mask, comprising providing a dielectric layer etch gas, wherein the dielectric layer etch gas is different than the mask etchant gas and the treatment gas and generating a plasma from the dielectric layer etch gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
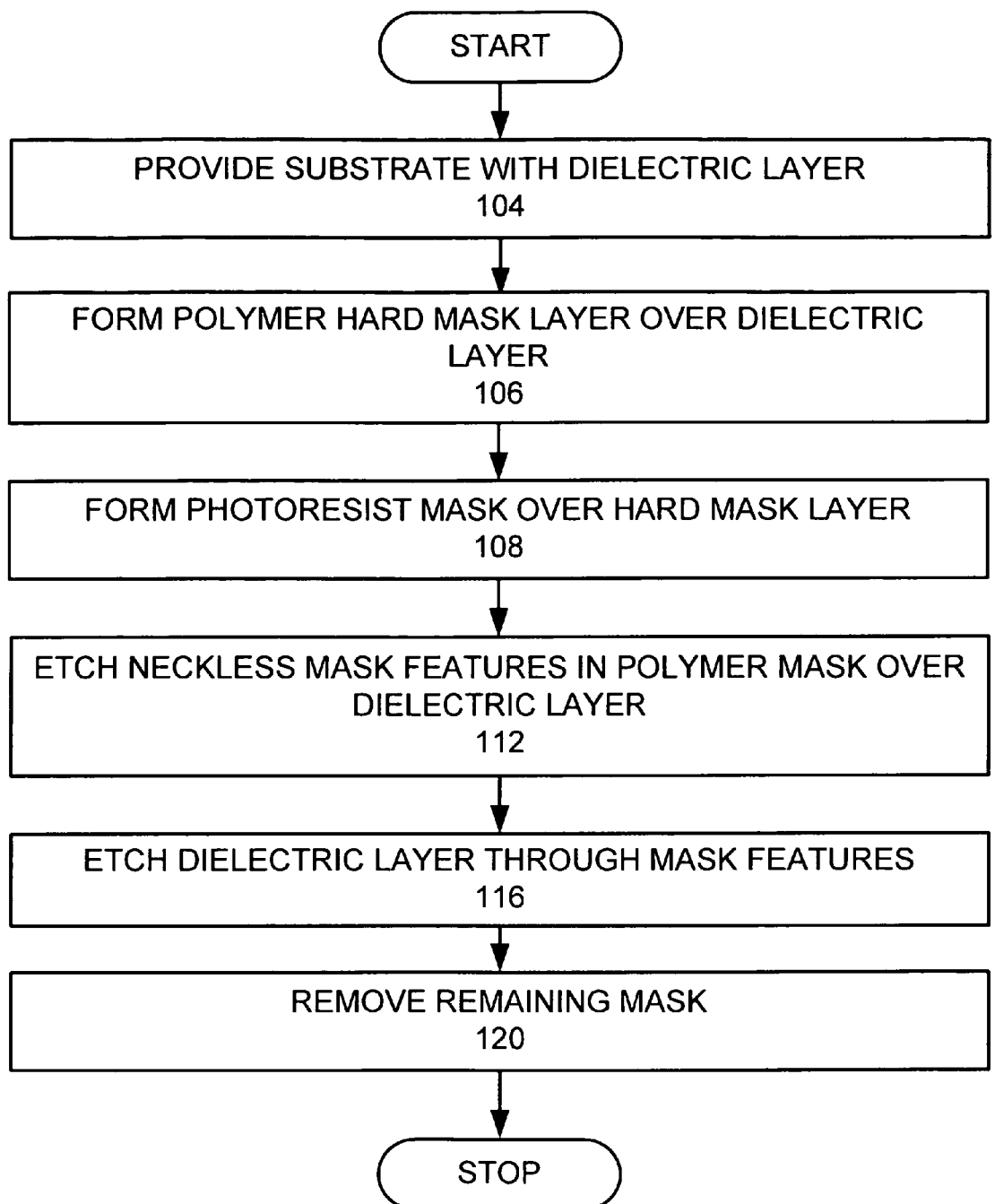
FIG. 1 is a flow chart of an embodiment of the invention.
Figure 2A:
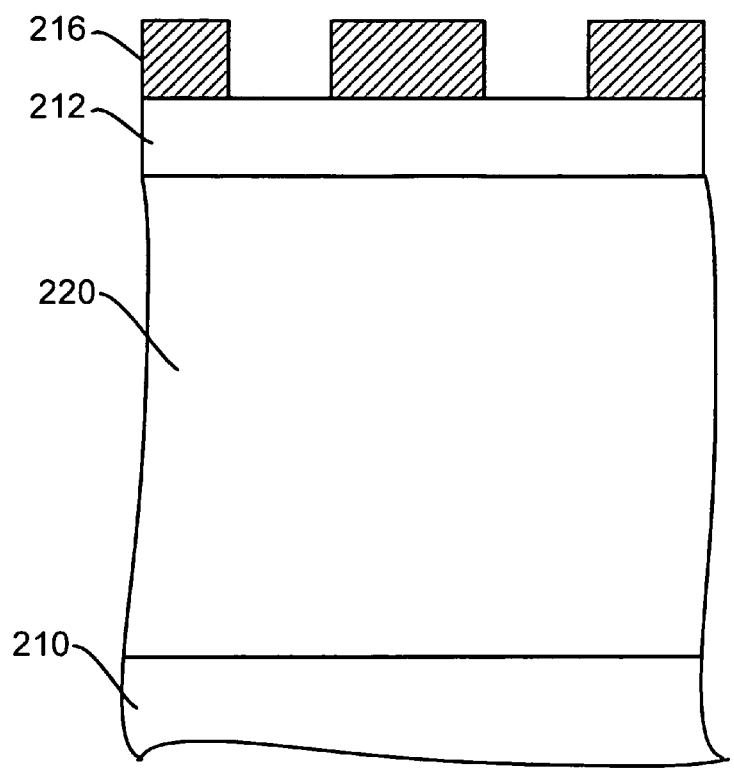
FIGS. 2A-D are schematic views of a layer etched in an embodiment of the invention.

To facilitate understanding, FIG. 1 is a high level flow chart of a process used in an embodiment of the invention. A substrate with a dielectric layer is provided (step 104). To facilitate understanding of the invention, FIG. 2A is a cross-sectional illustration of where a substrate 210 with a dielectric layer 220 is provided (step 104). In this embodiment of the invention, the substrate 210 is a silicon wafer and the dielectric layer 220 is a silicon oxide based low-k dielectric material or organic based low-k dielectric layer.

A polymeric hard mask layer 212 is formed over the dielectric layer 220 (step 106). The polymeric hard mask layer may be formed from various polymer materials, such as amorphous carbon or other photoresist materials (e.g. silicon enriched photoresist). Amorphous carbon is a carbon material, which may have different concentrations of incorporated hydrogen. Generally, the polymeric hard mask (e.g. amorphous carbon or silicon incorporated photoresist) is more etch resistant than the photoresist mask so that the polymeric hard mask acts as a hard mask for the subsequent dielectric etch.

Over the polymeric hard mask, a photoresist mask 216 is formed (step 108). It can be any type of photoresist, but preferentially a 248 nm or 193 nm photoresist material (PR) is used. The photolithography is used to open the desired mask in the photoresist.

Figure 2B:
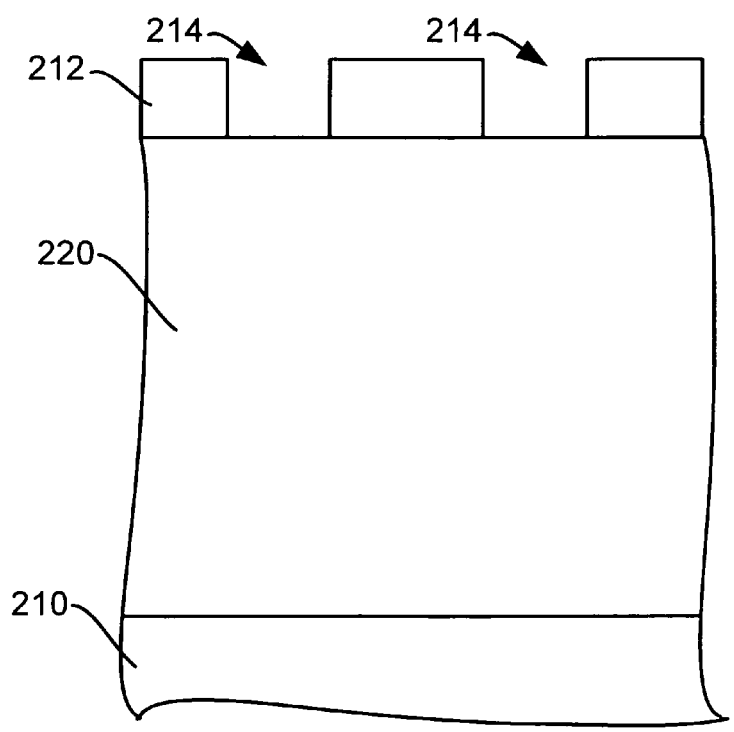

Neckless mask features 214 are etched into the polymeric hard mask layer (step 112), as shown in FIG. 2B. The photoresist mask is used to pattern the underlayer of polymeric hard mask material 212 for the etching of the neckless mask features 214. A plasma etch process is used to open the polymeric hardmask.

Figure 2C:
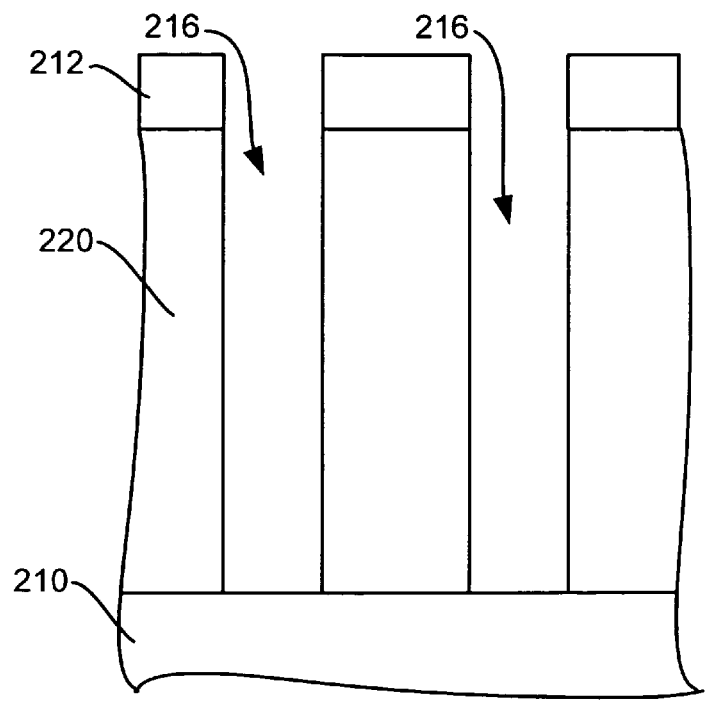
Figure 2D:
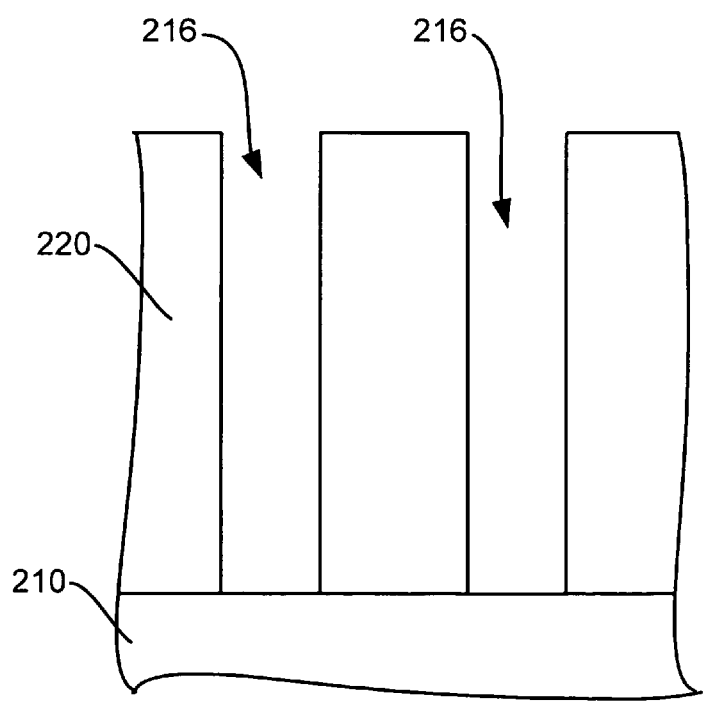

Etch features 216 are etched into the dielectric layer through the mask features (step 116), as shown in FIG. 2C. Since such an etch selectively etches the dielectric layer with respect to the polymeric hard mask the etch gas used to form the etch plasma for etching the dielectric layer is different from the etch gas used to generate the etch plasma for etching neckless mask features into the polymeric hard mask. The mask is then removed (step 120), as shown in FIG. 2D.

If the polymeric hard mask feature has a neck or bow, then the mask profile at the initial moments of etching the dielectric layer is a critical factor in determining the overall profile in the etched oxide layer. As a result, it was found that a neck in the mask features is detrimental to the profile of the feature etched into the dielectric layer. Therefore, according to the invention it was found that neckless mask features provide improved etched profiles of the etch features.

Although the teaching from this patent applies to basically any contact to be etched, preferably, the features in the etch layer are high aspect ratio contact (HARC) features with a height to width aspect ratio of at least 5:1. The advantage for HARC features is more pronounced, since necking would be more detrimental as the critical dimensions of the features decreases further.

Various embodiments are provided that allow the formation of neckless mask features, as provided below:

EXAMPLE

Figure 5:
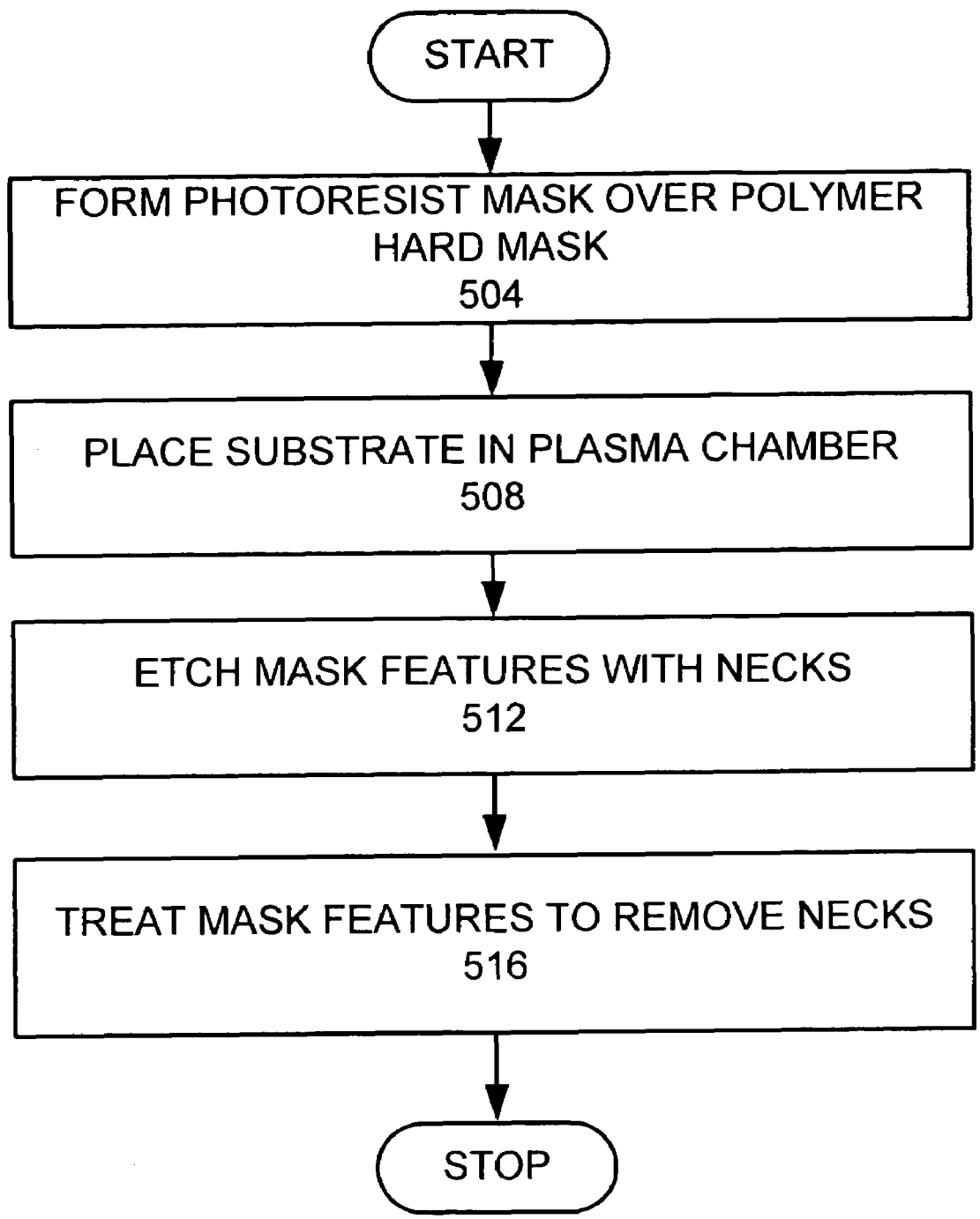
FIG. 5 a more detailed flow chart of a multiple step mask etch.
Figure 6A:
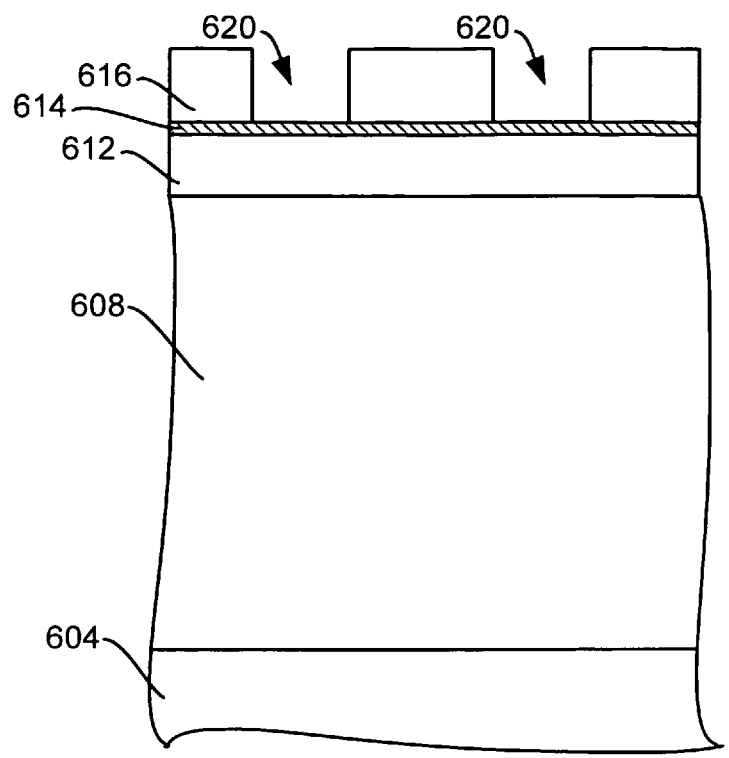
FIG. 6A-C are schematic views of a mask layer etched in an embodiment of the invention.

FIG. 5 is a more detailed flow chart of the steps of forming the photoresist mask over the hard mask layer (step 108) and etching neckless mask features in a polymeric hard mask over a dielectric layer (step 112) according to an embodiment. A photoresist mask is formed over the polymeric hard mask (step 504). FIG. 6A is a schematic cross-sectional view of a photoresist mask 616 with photoresist mask features 620 is formed over a polymeric hard mask layer 612. Preferentially, a layer of antireflective coating (ARC) 614 is added between the photoresist mask 616 and the hardmask layer 612. The ARC layer contains an inorganic and optionally, an organic ARC layer. A common inorganic material used for the ARC is SiON. This layer is usually opened in a plasma etch process before the polymeric hardmask is opened. The polymeric hardmask is formed over a dielectric layer 608, which is formed over a wafer 604. The wafer 604 is placed in a plasma chamber (step 508).

Figure 3:
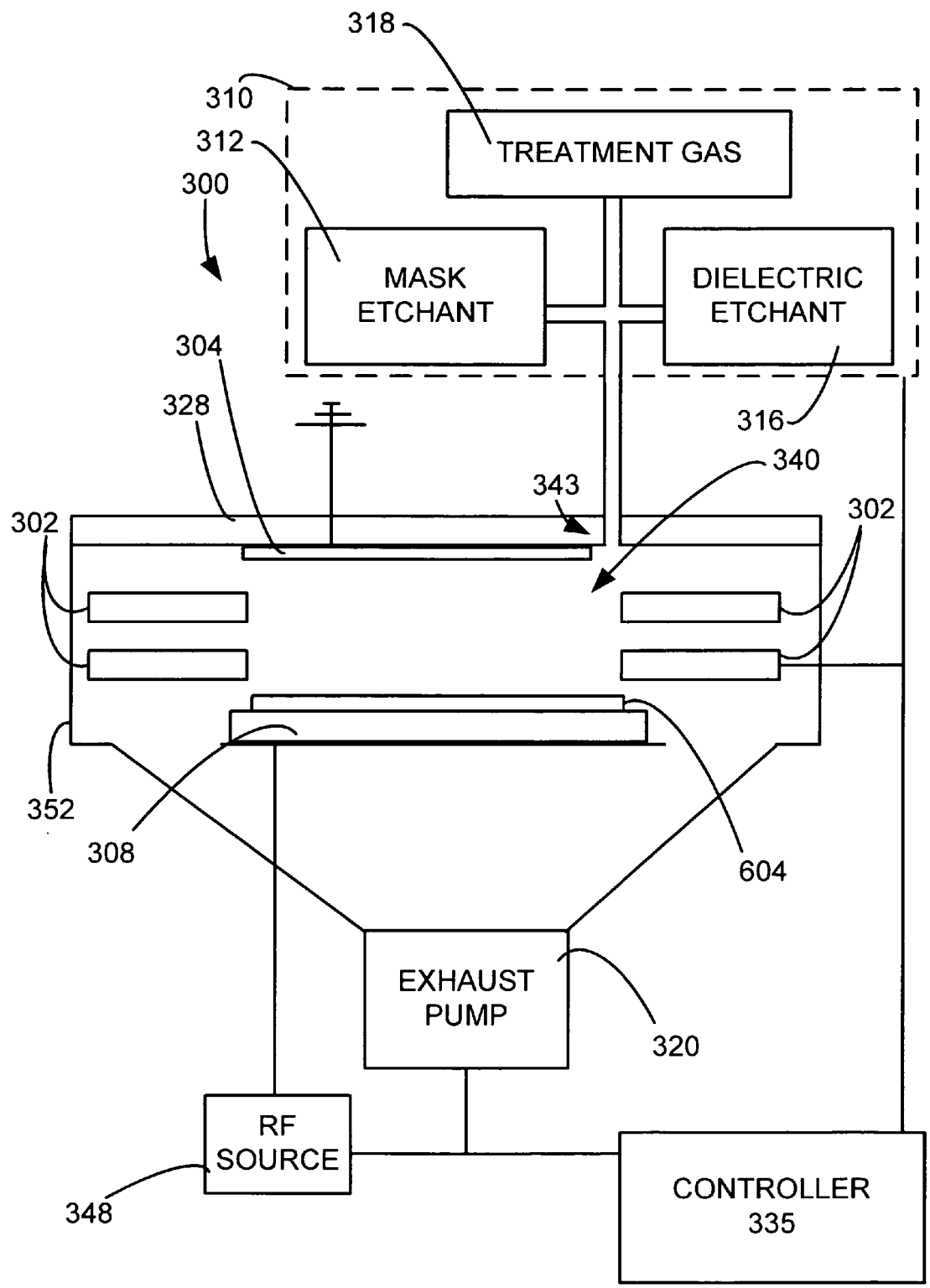
FIG. 3 is a schematic view of a plasma processing chamber that may be used for etching.

FIG. 3 is a schematic view of a plasma processing chamber 300 that may be used for inventive etching. The plasma processing chamber 300 comprises confinement rings 302, an upper electrode 304, a lower electrode 308, a gas source 310, and an exhaust pump 320. Within plasma processing chamber 300, the substrate 604 is positioned upon the lower electrode 308. The lower electrode 308 incorporates a suitable substrate chucking mechanism (e.g., electrostatic, mechanical clamping, or the like) for holding the substrate 604. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. Besides helping to exhaust the gas, the exhaust pump 320 helps to regulate pressure. In this embodiment, the gas source 310 comprises a treatment gas source 312, a mask etchant source 316, and a dielectric etchant source 318. The gas source 310 may further comprise other gas sources. An RF source 348 is electrically connected to the lower electrode 308. Chamber walls 352 surround the confinement rings 302, the upper electrode 304, and the lower electrode 308. Different combinations of connecting RF power to the electrode are possible. In a preferred embodiment, the 27 MHz, 60 MHz and 2 MHz power sources make up the RF power source 348 connected to the lower electrode, and the upper electrode is grounded. A controller 335 is controllably connected to the RF source 348, exhaust pump 320, and the gas source 310. The process chamber can be a: CCP (capacitive coupled plasma) reactor or an ICP (inductive coupled plasma) reactor.

Figure 4A:
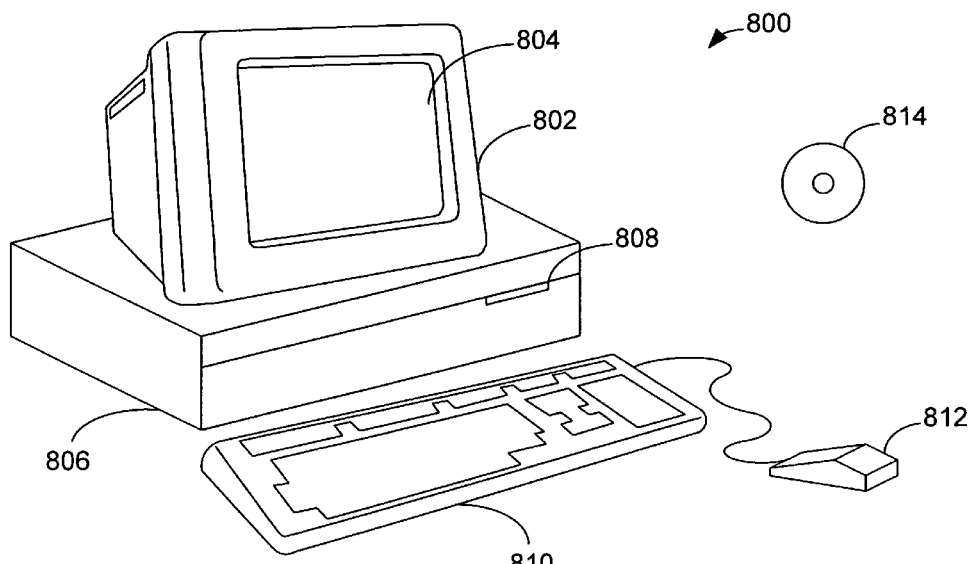
FIGS. 4A-B illustrate a computer system, which is suitable for implementing a controller used in embodiments of the present invention.
Figure 4B:
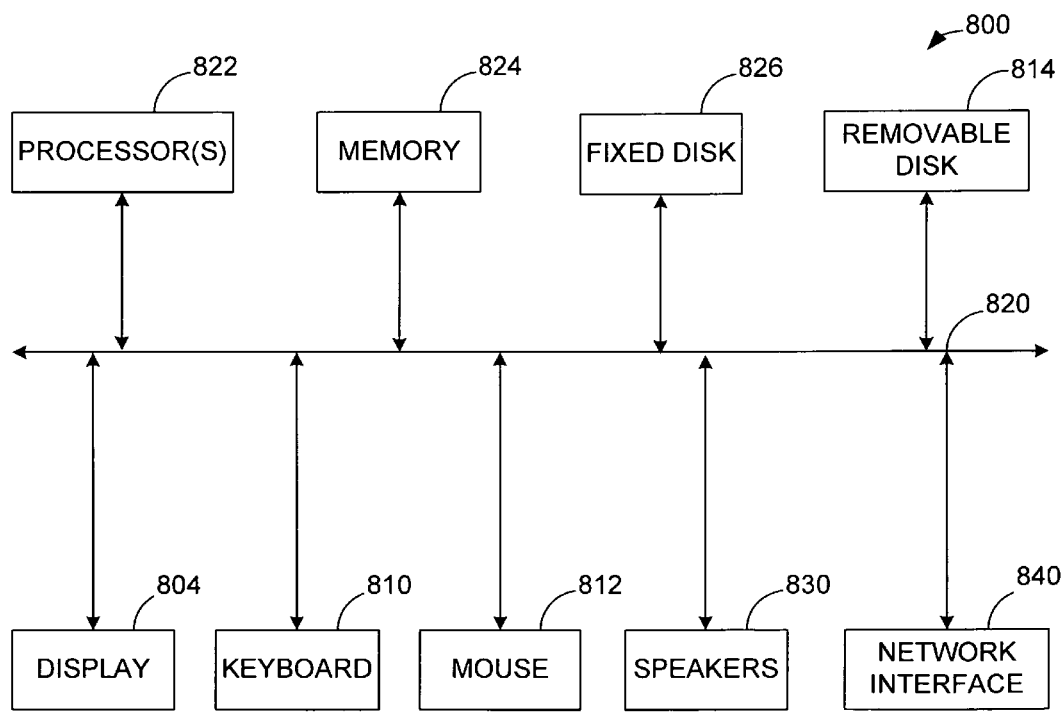

FIGS. 4A and 4B illustrate a computer system 800, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 4B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of the computer-readable media described below.

CPU 822 is also coupled to a variety of input/output devices, such as display 804, keyboard 810, mouse 812, and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6B:
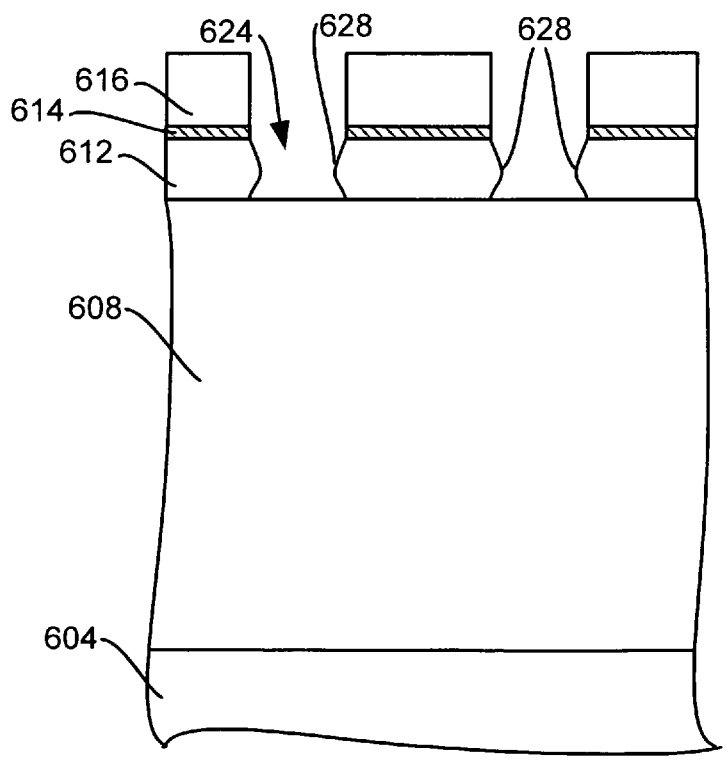

Polymeric hard mask features 624 with necks 628 are etched into the polymeric hard mask layer 612, as shown in FIG. 6B (step 512). An example recipe is as follows. A polymeric hard mask etchant gas of 100 sccm $N_2$ and 200 sccm $O_2$ is provided to the plasma processing chamber. The pressure in the plasma chamber is set at 20 mTorr. The RF source provides 900 Watts at 27 MHz and 700 Watts at 2 MHz to convert the mask etchant gas to a plasma. This is maintained for a period of 95 sec in order to open a mask of 5000 Å thickness. The plasma from the mask etchant gas is used to etch the polymeric hard mask features 624 into the mask layer 612, as shown in FIG. 6B. In another embodiment, the polymeric etchant gas consists of $N_2$ and $H_2$.

Figure 6C:
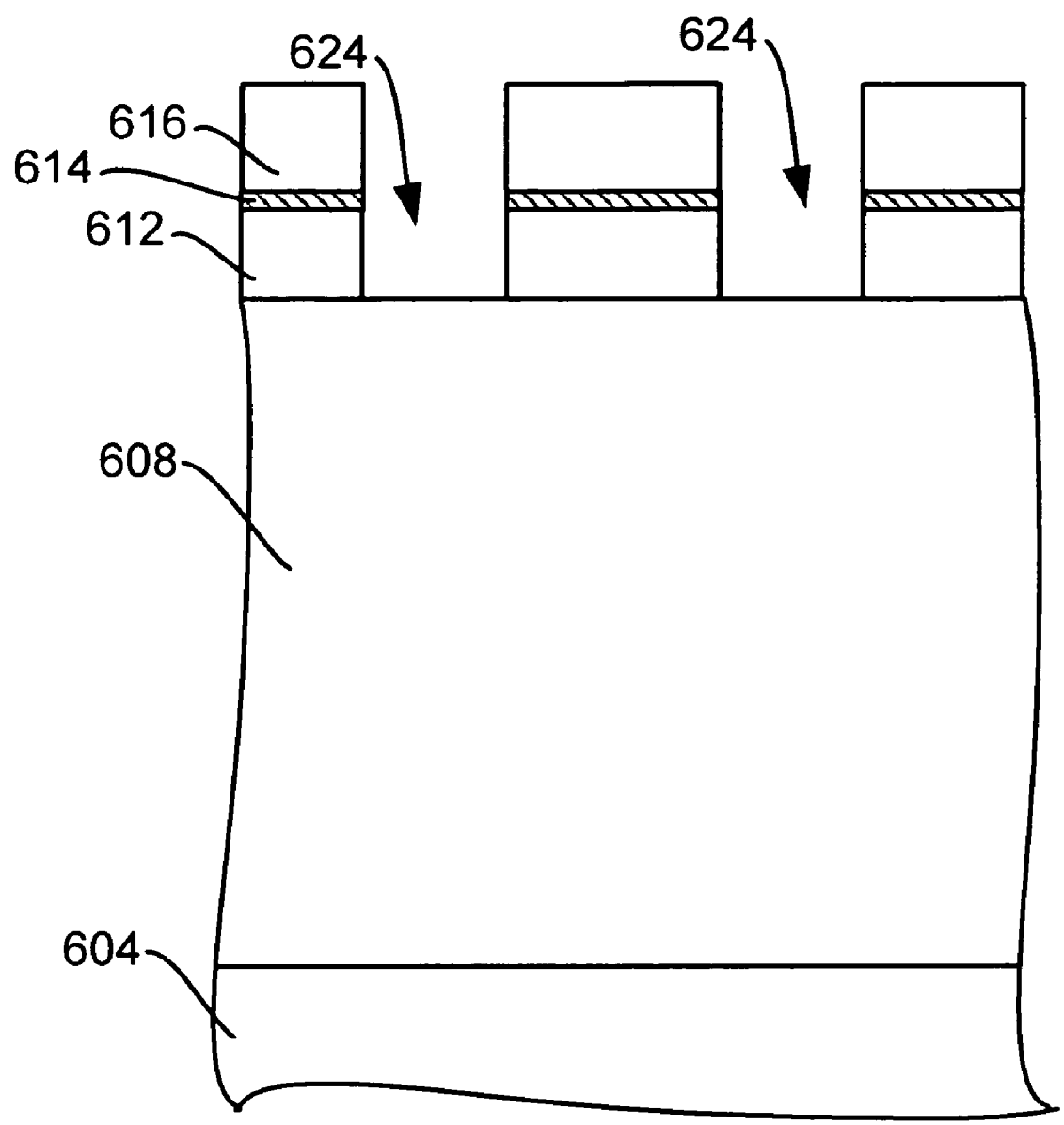

The polymeric hard mask features 624 are then treated to remove the necks (step 516), as shown in FIG. 6C. An example recipe is as follows. A treatment gas of 60 sccm $H_2$, 45 sccm $N_2$, and 10 sccm $CF_4$ is provided to the plasma processing chamber. The pressure in the plasma chamber is set at 60 mTorr. The RF source provides 600 W Watts at 27 MHz and 0 Watts at 2 MHz to convert the treatment gas to a plasma. This is maintained for a period of 10 sec. The plasma from the treatment gas is used to selectively etch the neck of the mask features 624.

Preferably, the treatment gas may be at least one of an $O_2$, $N_2$, and $CF_4$ gas mixture or a $N_2$, $H_2$, and $CF_4$ gas mixture. Any of these chemistries can be used to selectively etch the neck. The free oxygen in the $O_2$, $N_2$, and $CF_4$ plasma chemistry or the free hydrogen in the $N_2$, $H_2$, and $CF_4$ plasma chemistry etches the amorphous carbon. The pressure and power levels during the etch process can control the preferential removing of the necking into the mask. It is believed that the addition of free fluorine, by adding $CF_4$ to this plasma, is essential. The free fluorine has the capability of removing the Si atoms incorporated at the neck level as a result of sputtering of the ARC material (SiON) during the mask open process. More generally, the treatment gas comprises a fluorocarbon component, where preferably the fluorocarbon is $CF_4$, which provides a carbon to fluorine ratio that allows selective removal of the neck. Since the hard mask etchant gas provides a plasma that causes necking, the treatment gas is different than the hard mask etchant gas.

This embodiment may be used to etch silicon oxide based dielectric materials, such as silicon oxide, organo silicate glass, or other silicon oxide based material with lower dielectric constant. Preferably, the invention uses a 248 nm or 193 nm photoresist. Preferably, the same plasma processing chamber 300 is used for etching the polymeric hard mask features (step 512) treating the mask features (step 516), etching the dielectric layer (step 116), and removing the remaining mask (step 120), so that all of these features are done in-situ.

Test Results

Figure 7:
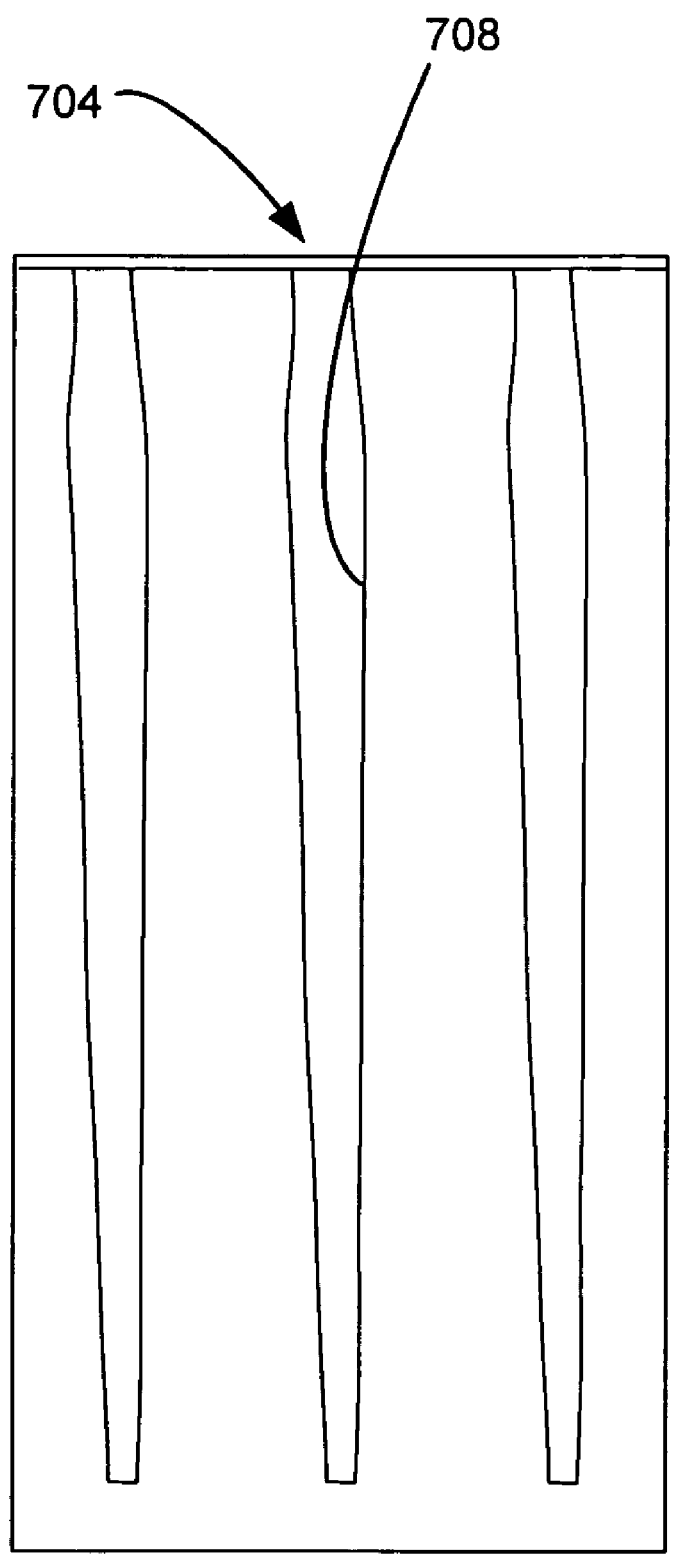
FIG. 7 is a picture of a cross-sectional view of features etched without the invention.

Tests were performed with two sets of etches. A first etch did not use a treatment step. The recipe used to open the polymeric hard mask contains as etchant gas 100 sccm $N_2$ and 200 sccm $O_2$. The pressure in the plasma chamber is set at 20 mT. The RF source provides 900 W at 27 MHz and 700 W at 2 MHz to convert the mask etchant gas to a plasma. This is maintained for a period of 95 sec in order to open a mask of 5000 Å thickness. The opening of the mask was followed immediately by the recipe for etching the underneath oxide layer through the polymeric mask. The process pressure for etching features into the underneath oxide layer was 40 mTorr. 1000 Watts were provided at 60 MHz. 200 Watts were provided at 27 MHz. 2800 Watts were provided at 2 MHz. An etch gas of 120 sccm Ar, 8 sccm $C_4F_6$, 9 sccm $C_4F_8$, and 17 sccm $O_2$ was provided for 245 sec. FIG. 7 are cross-sectional views of etch features 704 in an etch layer etched after the polymeric mask features were etched with the above recipe. The taper of the etch feature profiles 708 should be noted.

Figure 8:
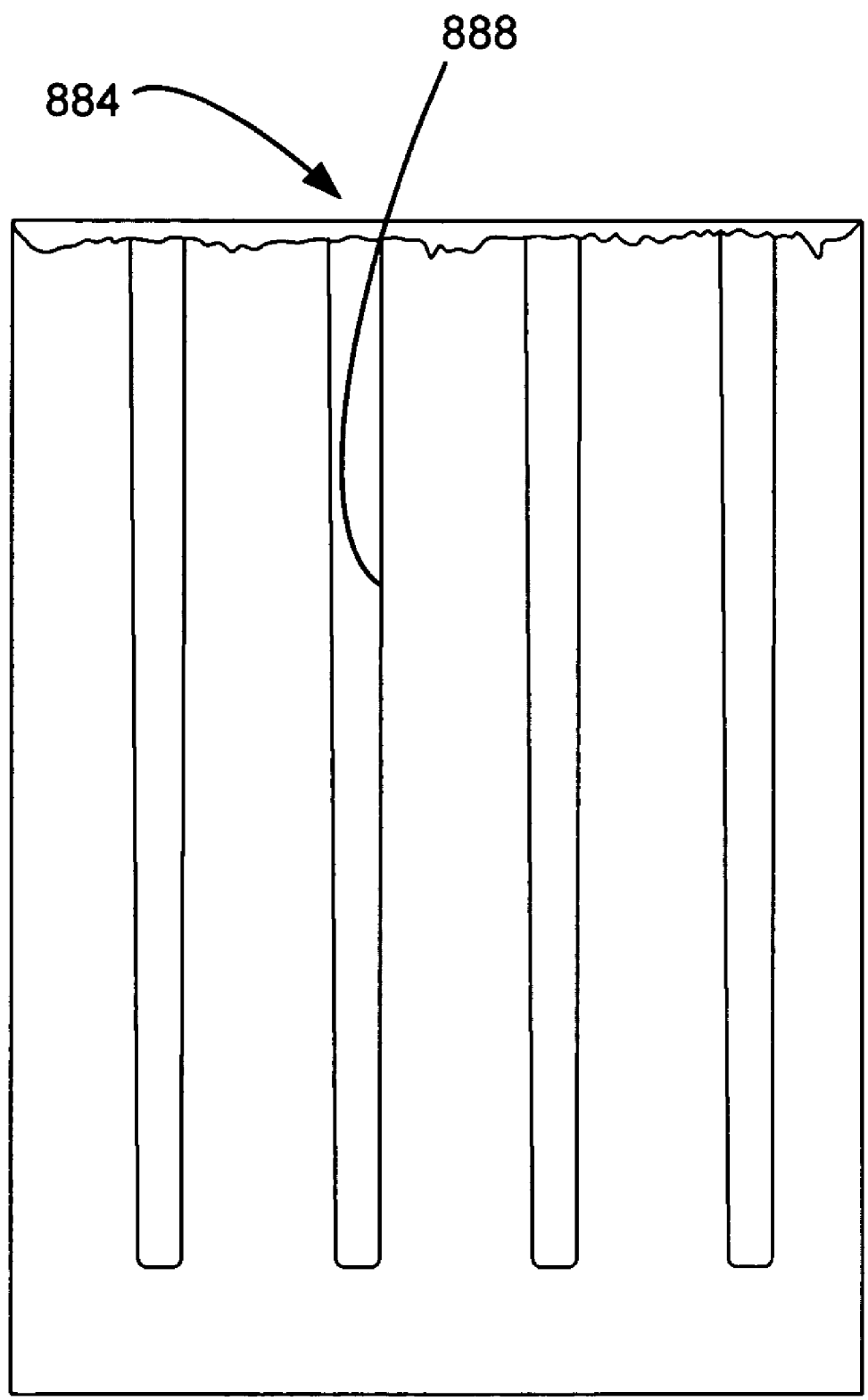
FIG. 8 is a picture of a cross-sectional view of feature etched using the invention.

A second etch used a treatment step. In this case, the polymeric mask opening process was followed by the mask treatment process. The etch of the underneath oxide layer was performed only after the mask treatment process was done. The recipe used to open the polymeric hard mask contains as etchant gas 100 sccm $N_2$ and 200 sccm $O_2$. The pressure in the plasma chamber is set at 20 mT. The RF source provides 900 W at 27 MHz and 700 W at 2 MHz to convert the mask etchant gas to a plasma. This is maintained for a period of 95 sec in order to open a mask of 5000 Å thickness. The opening of the mask was followed immediately by the treatment recipe of the mask. The recipe for the treatment provided 60 mTorr pressure, 600 Watts were provided at 27 MHz. 0 Watts were provided at 2 MHz. 10 sccm $CF_4$, 45 sccm $N_2$, and 60 sccm $H_2$ of a treatment gas were provided for 10 sec. The treatment process was followed by the etch process of the oxide underneath. The recipe for etching the underneath oxide layer through the polymeric mask provided a pressure of 40 mTorr. 1000 Watts were provided at 60 MHz. 200 Watts were provided at 27 MHz. 2800 Watts were provided at 2 MHz. An etch gas of 120 sccm Ar, 8 sccm $C_4F_6$, 9 sccm $C_4F_8$, and 17 sccm $O_2$ was provided for 245 sec. FIG. 8 are cross-sectional views of etch features 884 using the above recipe. The straight profile 888 should be noted.

While this invention has been described in terms of several preferred embodiments, there are alterations, permutations modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in a dielectric layer over a substrate and disposed below a polymeric hard mask, comprising:
    forming a patterned photoresist mask over the polymeric hard mask;
    placing the substrate in a plasma processing chamber;
    etching mask features into the polymeric hard mask through the photoresist mask, comprising:
        etching mask features with necks into the hard mask, comprising;
            providing a mask etchant gas;
            generating a plasma from the mask etchant gas; and
            stopping the flow of the mask etchant gas; and
        treating the mask features to selectively etch away the necks, comprising:
            providing a treatment gas comprising fluorocarbon, wherein the treatment gas is different than the mask etchant gas;
            generating a plasma from the treatment gas; and
            stopping the flow of the treatment gas;
    etching features into the dielectric layer through the polymeric hard mask, comprising:
        providing a dielectric layer etch gas, wherein the dielectric layer etch gas is different than the mask etchant gas and the treatment gas; and
        generating a plasma from the dielectric layer etch gas.

2. The method, as recited in claim 1, wherein the polymeric hard mask is amorphous carbon.

3. The method, as recited in claim 1, further comprising removing the polymeric mask.

* * * * *